United States Patent [19]

Frances

[11] 4,310,821

[45] Jan. 12, 1982

[54] SPIRALLED PRINTED INDUCTANCE

[76] Inventor: André L. Frances, 3, Allée des Ajoncs, Lannion, France, 22300

[21] Appl. No.: 72,483

[22] Filed: Sep. 4, 1979

[30] Foreign Application Priority Data

Sep. 8, 1978 [FR] France .............................. 78 25927

[51] Int. Cl.³ .............................................. A01F 27/78
[52] U.S. Cl. ................................... 336/200; 336/221; 336/232; 360/123
[58] Field of Search ...................... 360/123, 125, 122; 335/299, 213, 282; 336/200, 222, 223, 225, 232

[56] References Cited

U.S. PATENT DOCUMENTS

| 2,014,524 | 9/1935 | Franz | 336/200 |
| 2,831,135 | 4/1958 | Hanlet | 336/200 X |
| 2,831,136 | 4/1958 | Hanlet | 336/200 X |
| 3,238,480 | 3/1966 | Killoran | 336/200 X |
| 3,697,911 | 10/1972 | Strauss, Jr. | 336/200 X |

*Primary Examiner*—Thomas J. Kozma
*Attorney, Agent, or Firm*—Abraham A. Saffitz

[57] ABSTRACT

The printed inductance comprises at least a first conductive rectangular spiral having its geometric origin on the long midline of the rectangle and which is adapted to be folded at its midline while being supported by one of the faces of a flexible insulating supporting-plate. The supporting-plate is folded back through 180° along the midline axis passing through the geometric origin of the spiral. The geometric origin of the rectangular spiral coincides with the internal connecting terminal of the conductive spiral, so as to produce a magnetic field which is coplanar with the plane of the folded supporting-plate. A second conductive spiral conforming in every respect to the first spiral may be supported by the other face of the supporting-plate. The first and second rectangular spirals are thus seen to be identical and symmetrical with respect to the fold axis. A hole having metallized walls connects the internal terminals of the spirals therebetween. A flat magnetic element and/or an insulating insert may be sandwiched by the inside facing half-faces of the supporting-plate. The printed inductance which is so constructed and arranged may be used in a magnetic transcription device.

8 Claims, 13 Drawing Figures

SPIRALLED PRINTED INDUCTANCE

BACKGROUND OF THE INVENTION

1. Field of the Invention

The present invention relates to a printed inductance comprising a flexible insulating supporting-plate and at least one first rectangular conductive spiral supported by one of the faces of the supporting-plate.

2. Description of the Prior Art

Conventional inductances of coil type which form magnetic circuits of small thickness which can be employed in the reading heads of telecopier devices, for example, are quite often unable to be produced by means of automatic equipment because of the high ratio between the widths and the thickness of the straight sections of the coil. The minimum diameter of the winding wires which are employed in known winding machines if still much too large for producing thin magnetic circuits.

In order to correct these disadvantages spiral-formed inductances have been manufactured by the known technique for making printed circuits. Such spiral-formed printed inductances are disclosed in the French Patent Application No. 2,331,481 and are obtained in particular by engraving upon a thin metallized plate. The widths of the turns of these inductances are not of uniform width in order inter alia to equalize the resistances of the turns. Other printed inductances of the type previously defined have been described in the French Pat. No. 2,118,246. These latter inductances are produced with very fine conductive turns and are engraved upon an intermediate metallized layer which is sandwiched by two metallized layers in order to ensure mechanical protection of both the inductance and the fine strands forming the terminals of the inductance. The entire three layers of this construction produces a printed circuit known as a multilayer circuit. Spiral formed printed inductances have been made by photoengraving and are stacked in order to obtain coupled circuits of band pass type such as those described in the French Pat. No. 1,570,049. These inductances are separated from one another by metal screens provided with slits in order to ensure suitable magnetic coupling between the superimposed inductances. The French Pat. No. 1,476,476 discloses a double-spiralled printed inductance of this type which is formed by two conductive spirals deposited on a flat insulating plate. The internal connecting terminals of the two spirals are connected by a metal filled hole. The spirals are identical and the North magnetic pole of one of spirals and the South magnetic pole of the other spiral face each other.

All of the aforesaid inductances, of spiral-form and printed each upon a plane supporting-plate produce a magnetic field perpendicular to their supporting-plates and for this reason these inductances are poorly adapted for use in telecopier devices or other rapid transcribers. In this type of transcriber device the definition of the points must be of the order of a hundred microns and consequently the distribution of the magnetic field proceeding from the magnetic coupled circuits, requires having a pitch of the order of a hundred microns which is incompatible with the stacking or superimposition in one and the same row of inductances of the known species. The employment of these inductances necessitates a complicated mechanical structure of the reading head of the telecopier from the fact that the width of the inductances is greater than the pitch requested for the reading definition.

OBJECT OF THE INVENTION

The principal object of the present invention is to provide printed inductances of the spiral-formed type, which produce a strong magnetic field coplanar with their supporting-plates. Contrary to prior technique, the plates of the inductances of very small thickness may be simply stacked in parallel one above the other and perpendicular, for example, to the axis of the magnetic drum of a telecopier.

SUMMARY OF THE INVENTION

Accordingly, a printed inductance embodying the invention comprises a flexible insulating supporting-plate and a coil identical to a conductive spiral supported by one of the faces of said supporting-plate, said supporting-plate being folded back through 180° along a fold axis passing through the connecting terminal internal of said spiralled coil, and said internal terminal of said spiralled coil coinciding with geometric origin of said spiral forming said coil. The usable magnetic field which is produced by the micro-current passing through the conductive spiral is concentrated at the level of the origin of the spiral which is the center of a hole pierced in the supporting-plate and forming a notch after folding.

The supporting-plate may likewise support a second conductive spiral on its other face in order to increase the number of turns of the inductance and consequently the intensity of the magnetic field. In this case, before folding, two conductive spirals are photoengraved upon the two faces of a metallized flexible supporting-plate or deposited upon an insulating flexible supporting-plate or obtained by any other similar method. The two conductive spirals are symmetrical with respect to a fold axis passing through a hole having metallized walls and connecting the internal terminals of the two conductive spirals, so the the current flow upon the two faces of the supporting-plate is directed along the same direction of rotation through the metallized hole forming a notch after folding. For certain applications, the supporting-plate supports two connecting conductors forming the terminals of the double-spiralled inductance. Each of the connecting conductors has one of its ends connected to the peripheral end of one of the spirals and its other end projecting from the supporting-plate and obtained by punching the supporting-plate.

The singly or doubly spiral-formed printed inductance may include between the inside half-faces of the folded supporting-plate a flat magnetic element of thickness less than that of the fold in order to produce a magnetic circuit. The magnetic element may be covered by an insulating layer and/or the inductance may comprise an insulating insert element which is interposed between the inside half-faces of the supporting-plate and the magnetic element when it is present.

BRIEF DESCRIPTION OF THE DRAWING

Other advantages of the present invention will be apparent from the following more particular description of the preferred embodiments of the invention as illustrated in the accompanying corresponding drawings in which.

DESCRIPTION OF THE PREFERRED EMBODIMENTS

Figure 1:
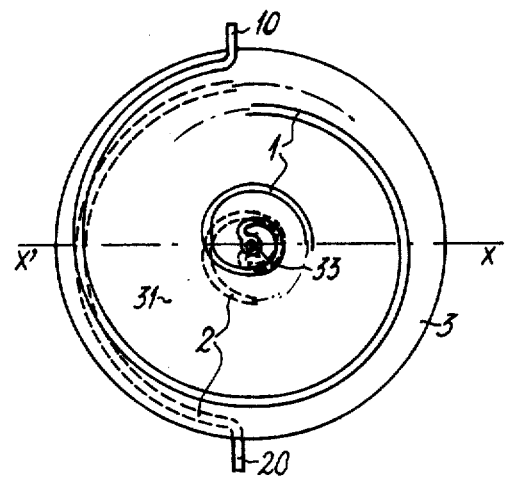
FIG. 1 shows a front face of a printed inductance formed in a circular single or double spiral, before folding.
Figure 2:
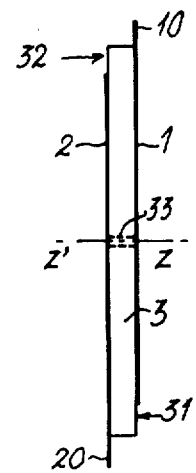
FIG. 2 is a side view of the inductance of FIG. 1.

In FIGS. 1 and 2 there is shown before folding a spiral-formed printed inductance in accordance with the invention. It consists of a conductive spiral 1 engraved or deposited upon one 31 of the faces of a thin supporting-plate 3 or of two spirals 1 and 2 engraved or deposited respectively upon the two faces 31 and 32 of the supporting-plate 3. This supporting-plate 3 is of suitable flexible insulating material.

In the case of a double-spiralled inductance, the two spirals 1 and 2 have their geometric origins which coincide therebetween and are connected electrically therebetween by a metallized central hole 33 in the supporting-plate 3. The polar angles of the spirals 1 and 2 are opposed on opposite sides of the hole 33 so that the current flowing in the spirals 1 and 2 when they are superimposed always passes in the same direction of rotation around the origin hole 33. This characteristic is shown in FIG. 1 where the profile of the spiral 1 supported by the face 31 is represented in solid fine lines and where the profile of the spiral 2 supported by the face 32 is represented in short interrupted lines and is substantially symmetrical with the spiral 1 with respect to the folding axis e.g., the axis of fold X'X which is coplanar with the plate 3 and passes through the metallized hole 33 of the internal connecting terminals of the conductive spirals 1 and 2.

Only the peripheral and central turns of the spirals 1 and 2 have been shown in FIG. 1 in order to not overload it with the large number of turns, here circular, of the printed inductance. The peripheral turns of the spirals 1 and 2 terminate in conductive connector strips 10 and 20 forming the terminals of the double-spiralled printed inductance. In the case of a singly spiral-formed inductance the terminals of the inductance are the conductive strip 10 of the single spiral 1 and the hole 33 no longer needs to be metallized, and are centered at the origin of the spiral 1.

The printed inductances of the invention may be produced on sheets of flexible insulating material cutting out or punching from these in shapes adapted to their use. The sprial may be curvilinear, polygonal, rectangular or square or any other similar shape as seen in reference to FIGS. 7A and 7B. The spirals are obtained in accordance with known methods of high-definition engraving upon metallized plate in order to obtain a large number of turns or in accordance with known thin-film metallization or deposit methods or other suitable method upon a flexible insulating non-metallized plate.

In the following description, the distribution of the magnetic field will be considered regardless of whether the coil has a single or double spiral form and regardless of the direction of the current passing through one spiral or two spirals. Reversal of the current produces reversal of the magnetic fields and that in the case of a double-spiralled inductance the magnetic fields associated with the two spirals add up since the current path in the spirals runs always in the same direction round the centre 33 of the supporting-plate.

Figure 3A:
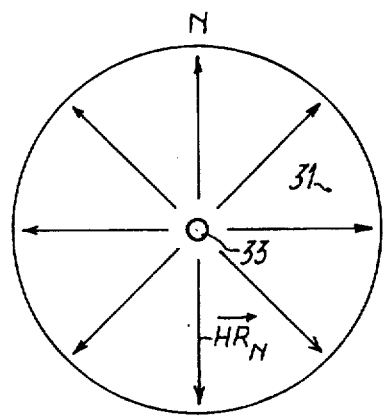
FIGS. 3A, 3B and 3C are diagrams showing the distribution of the magnetic field perpendicular to the supporting-plate of an inductance and upon the front and rear faces of it, before folding.
Figure 3B:
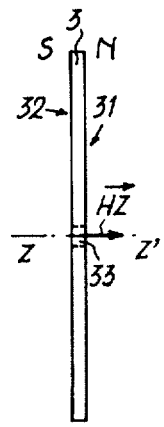
Figure 3C:
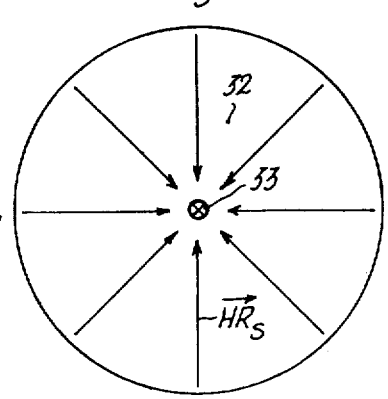

When an electric current flows through the printed inductance, a magnetic field is produced in the immediate environment of the inductance and may be resolved into:

(a) a resulting $\vec{HZ}$ coaxial with the axis of symmetry Z'Z which is perpendicular to the plate 3 and centered upon the hole 33, as shown in FIGS. 3A, 3B and 3C;

(b) radial and divergent components $\vec{HR}_N$ across one of the faces, for example 31, of the supporting-plate 3 depending upon the direction of the current, and creating by symmetry a zero resultant and a pole called North N, as shown in FIG. 3A; and (c) radial and convergent components $\vec{HR}_S$ across the other face, 32, of the supporting-plate 3 and creating by symmetry a zero resultant and a pole called South S, as shown in FIG. 3C.

Figure 4:
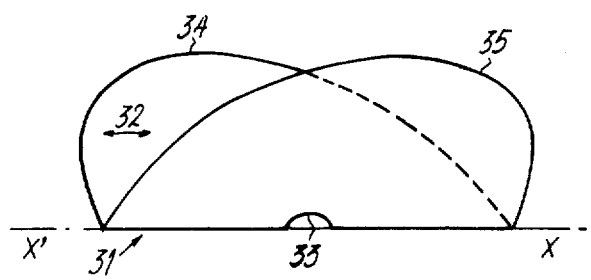
FIG. 4 is a diagrammatic perspective view of the supporting-plate during the course of folding.

In accordance with the invention, the supporting-plate 3 of the inductance as shown in FIGS. 1 and 2 is folded back through 180° in two portions 34 and 35 as shown in FIG. 4; the axis of fold X'X coincides with one of the polar radii if the spiral or both spirals are curvilinear or polygonal, or coincides along one of the minor or major orthogonal axes if the spiral or both spirals are rectangular. It will be assumed below that the South face 32 is inside the fold and that the North face 31 is outside the fold.

Figure 5A:
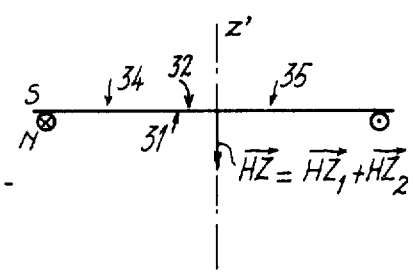
FIGS. 5A, 5B and 5C are diagrams showing the distribution of the magnetic field before, during the course of, and after folding through 180° of the supporting-plate.
Figure 5B:
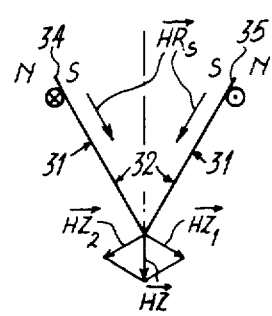
Figure 5C:
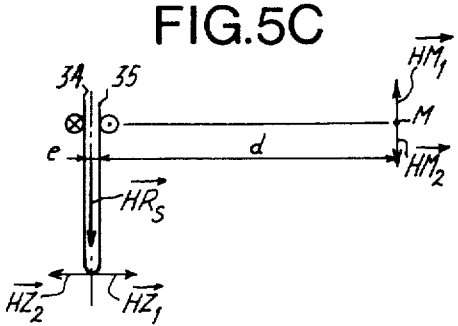

Referring to FIGS. 5A, 5B and 5C which show the components of the magnetic field respectively before folding, during the course of folding and after folding in accordance with the hypotheses expressed previously with reference to FIGS. 3A to 3C, the vectorial resolution of the components of the magnetic field discloses:

(a) that the axial resultant $\vec{HZ}$ is destroyed by its resolution into two components $\vec{HZ}_1$ and $\vec{HZ}_2$ which are opposed and equal in modulus and which are perpendicular to the opposed half-faces of the portions 34 and 35;

(b) that the radial components $\vec{HR}_S$ and $\vec{HR}_N$ of the inside half-faces of the portions 34 and 35 of the imprisoned South face 32, as shown in FIGS. 5B and 5C, or the imprisoned North face 31 in accordance with the other similar case, not shown, add up instead of cancelling out as in the case of FIGS. 3C or 3A; and (c) that in immediate proximity to the two peripheral edges of the portions 34 and 35 the magnetic field decreases rapidly; referring to FIG. 5C, if e designates the thickness of the folded supporting-plate 3, a point M located at a distance d from the fold plane coplanar with the axis X'X is the seat of two components $\vec{HM}_1$ and $\vec{HM_2}$ which are opposed in a ratio equal to $1+2\ e/d$, neglecting the term of the second order.

Figure 6:
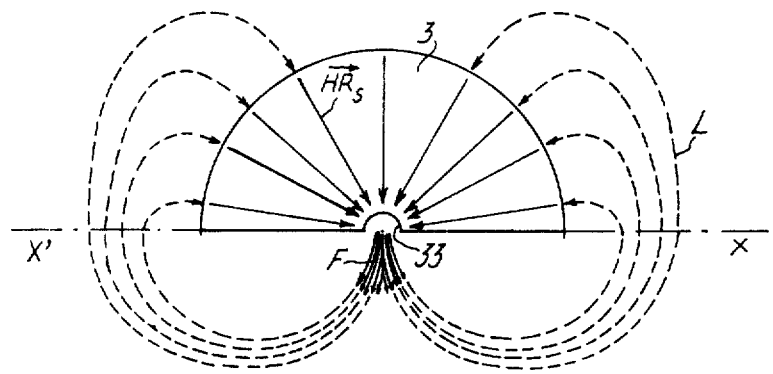
FIG. 6 is a diagram showing the force lines of the magnetic field for an inductance having the inside half-faces of the folded supporting-plate polarized as a south pole.

Thus in the case where the South face 32 is imprisoned by folding, as shown in FIG. 6, the printed inductance is similar to a concentrator of the lines L of the radial field $\vec{HR}_S$ towards the central hole 33 in the plate 3. In FIG. 6, the vectorial sum of the internal radial components $\vec{HR}_S$ proceeding from the central hole 33 which forms a notch after folding, is represented by a dense bundle F of force lines.

Figure 7A:
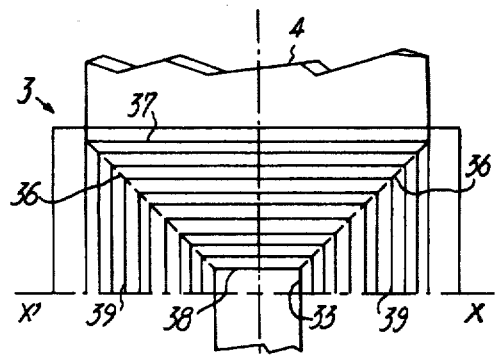
FIGS. 7A and 7B are diagrammatic front views of printed inductances embodying the invention, having rectangular turns and comprising a magnetic element.
Figure 7B:
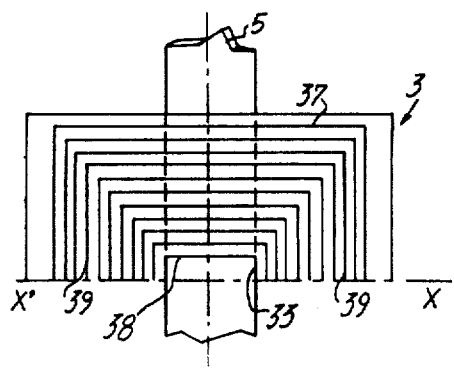

In accordance with another embodiment of the invention, shown in FIGS. 7A and 7B, the supporting-plate 3 of the printed inductance is folded back over a magnetic element 4 or 5 which has a thickness less than e and which constitutes the core of a magnetic circuit. FIGS. 7A and 7B represent two examples of such printed inductances formed in single or double spirals, which have rectangular contours. The folded axis X'X coincides with the major axis of the spirals.

The inductance shown in FIG. 7A encloses a thin flat magnetic metal sheet 4 the trapezoidal profile of which is placed next to two semi-diagonals 36 of the two half-faces of the portions 34 and 35 and converges from the two major sides 37 of the peripheral rectangular turn or two turn towards the two major sides 38 of the central rectangular turn or two turns. In the case of the inductance shown in FIG. 7B the element 5 is a rectangular flat magnetic metal sheet. Its width is substantially equal to the two major sides 38 of the central rectangular turn or two turns and the middle line of the magnetic sheet 5 is perpendicular to the major sides of the turns. The straight conductive strips perpendicular to and placed next to the axis of the element 4 or 5, that is to say at least a portion of the major sides of the turns, such as 37 and 38, are alone generative of an induction in the magnetic circuit thus formed. They are equivalent to the winding of a conventional inductance which would have been flattened on a flat magnetic bar and of which the sides would have been eliminated relative to the thickness of the circuit. The other conductive strips coinciding for the most part with the minor sides of the turns, such as 39, are inoperative upon the induction and serve only for the return of the current. The magnetic element 4 or 5 may be coated with an insulating layer (not shown) or may be sandwiched by two insulating inserts (not shown), when a conductive spiral is present on the two inside half-faces of the supporting-plate. The insulating layer or the two insulating inserts separate the magnetic metal sheet from the inner turns of the inductance.

Figure 8:
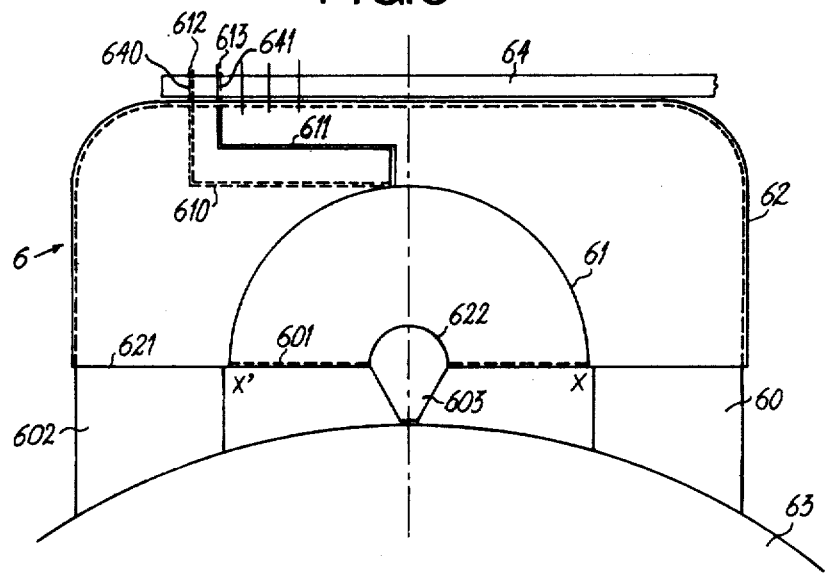
FIG. 8 shows diagrammatically a printed inductance embodying the invention inserted in the stack of a magnetic transcription head.

Referring now to FIG. 8, a preferred embodiment is described for the employment of printed inductances which relate to the realisation of a magnetic transcription head having a magnetic field perpendicular to the axis of the magnetic drum of a telecopier.

This transcription head is composed of a stack of magnetic circuits which is perpendicular to the plane of FIG. 8 upon which is shown a single magnetic circuit 6. The length of this stack is substantially equal to the width of the sheet for transcription, for example, to the standard form. The magnetic circuits are superimposed in parallel with the plane of FIG. 8 and are distributed equally along the length of the stack at a pitch of 125 μm which corresponds with a definition of 8 points per millimeter.

The magnetic element 60 of a magnetic circuit 6 plays the part of core for the printed inductance 61 of the type as described according to FIGS. 1, 2 and 6 and consists of a magnetic metal sheet the U shape of which is obtained by punching. Each magnetic metal sheet 60 has been treated thermally as to obtain the magnetic characteristics requested for transcription. Then a thin insulating layer is deposited on its two faces. The complete magnetic circuit is obtained by means of a deposit or of the engraving of a spiral-formed printed inductance 61 upon a flexible insulating supporting-plate 62 which is folded back through 180° over the magnetic metal sheet 60. The fold axis X'X of the plate 62 is in part held against the inside bottom 601 of the U end of the magnetic metal sheet 60 in front of the width of the inductance. The feet 602 and the trapezoidal centre 603 of the magnetic metal sheet 60 pass through the ends 621, and the metallized hole in the supporting-plate 62 which forms a notch 622 after folding. The feet 602 overhang the magnetic drum 63 of the transcriber. Two insulating inserts (not shown) having a shape similar to the supporting-shape 62 may be sandwiched between the inside faces of the plate 62 and the magnetic metal sheet 60, preferably if a thin insulating layer is not deposited on the magnetic metal sheet 60 and/or if the internal portions of the folded supporting-plate 62 support a conductive spiral.

The printed inductances 61 are obtained, for example, by punching from one or more flexible insulating sheets metallized on both faces and by engraving these. Each printed inductance 61 includes a hundred or more turns on each of its inside and outside faces in order than the current necessary to the magnetization is some tens of milliamps.

There may likewise be seen in FIG. 8 the two connecting conductors 610 and 611 which serve as terminals for the inductance 61 and which are obtained during the previous engraving of the inductance turns. The ends of the conductors 610, 611 are cut out during the punching operation from the supporting-plate 62 in order to form strands 612 and 613 which are suitable for being embedded in two conductive seatings 640 and 641 in a suitable small bar or grid 64 which likewise receives the ends or conductive strands from the other inductances of the stack. Such a bar or grid 64 may itself advantageously be a multilayer printed circuit which enables the various electrical members of the transcriber to be connected electrically and supported and consequently wiring operations to be eliminated.

While particular embodiments of the invention have been described only by way of example, it will be apparent to those skilled in the art that other modifications and changes may be made with respect to the form and construction thereof without departing from the scope of the invention defined by the attached Claims. This it is possible, depending upon each application, to adapt the shapes of the turns of the inductance, of the magnetic element and of the insulating supporting-plate as well as the folding. Finally, a number of printed inductances may be stacked and connected in series in order to obtain a printed inductance having a multilayer of turns with insulating inserts and with or without magnetic elements.

What I claim is:

1. A printed inductance comprising:
   a flat flexible insulating supporting plate;
   a first printed conductive spiral supported on one face of said plate;
   a second printed conductive spiral on another face of the plate which is parallel to the one face;

said first and second spirals conductive having a midline folding axis which divides the spirals and serves as a folded edge to provide a width half of the original width;

said flat plate said first spiral and said second spiral being folded back through 180°;

said first and second spirals having an origin which lies on said folding axis;

said first and second spirals having the same direction of rotation around said origin with one half of the first spiral being symmetrical with one half of the second spiral which is on the opposite side of the folding axis; another half of the first spiral being symmetrical with respect to anther half of the second spiral which is on the opposite side of the folding axis; and said flexible plate and spirals being provided with a metalized hole electrically connecting said spirals together at the origin of said spirals;

2. A printed inductance as in claim 1 comprising a flat magnetic element which is sandwiched by one part of the inside facing half faces of said folded supporting plate and one end of which passes through said hole.

3. A printed inductance as in claim 2 in which the portion of said magnetic element sandwiched by said inside facing half faces of said folded supporting plate extends symmetrically on the opposite sides of an axis of symmetry of said spiral which is perpendicular to said folding axis and is sandwiched by part of all of the turns of said spirals.

4. A printed inductance as in claim 3 including connecting conductors supported by the faces of said plate, said conductors having one end connected to the peripheral end of each of said spirals.

5. A printed inductance as in claim 1 comprising a flat magnetic element which is sandwiched by at least one part of the inside facing half faces of said folded supporting plate and one end of which passes through said metallized hole.

6. A printed inductance as in claim 5 in which said magnetic element is covered by an insulating layer.

7. A printed inductance as in claim 5 in which the portion of said magnetic element sandwiched by said inside facing half faces of said folded supporting plate extends symmetrically on opposite sides of a symmetry axis of said first and second spirals perpendicular to said folding axis and is sandwiched by part of all of the turns of said first and second spirals.

8. A printed inductance as in claim 1 comprising a flat magnetic element and two insulating inserts which are sandwiched by the two inside facing half faces of said folded supporting plate.

* * * * *